(12) United States Patent
Nakao et al.

(10) Patent No.: US 6,306,511 B1
(45) Date of Patent: Oct. 23, 2001

(54) HYBRID LAMINATE AND MANUFACTURING METHOD THEREFOR

(75) Inventors: Shuya Nakao, Yokaichi; Hirokazu Kameda, Kusatsu; Shigeyuki Kuroda; Kenji Tanaka, both of Shiga-ken; Masaru Kojima, Hikone, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/620,856

(22) Filed: Jul. 21, 2000

(30) Foreign Application Priority Data

Jul. 27, 1999 (JP) .................................................. 11-211546

(51) Int. Cl.⁷ ...................................................... B32B 17/06
(52) U.S. Cl. ........................ 428/426; 428/427; 428/428; 428/432; 228/121; 156/5; 156/10; 156/38; 156/40
(58) Field of Search ..................................... 428/426, 427, 428/428, 432, 446, 688; 228/121, 122.1, 123.1; 156/5, 10, 38, 40

(56) References Cited

U.S. PATENT DOCUMENTS

| 4,313,026 | * | 1/1982 | Yamada et al. ..................... 174/68.5 |
| 4,624,896 | * | 11/1986 | Watanabe et al. .................... 428/428 |
| 5,474,741 | * | 12/1995 | Mikeska et al. ........................ 419/10 |
| 5,506,058 | * | 4/1996 | Ikuina et al. ........................... 428/426 |
| 5,827,605 |  | 10/1998 | Nishide et al. . |
| 5,876,536 | * | 3/1999 | Kumar et al. ..................... 156/89.11 |

* cited by examiner

*Primary Examiner*—Deborah Jones
*Assistant Examiner*—Gwendolyn A. Blackwell-Rudasill
(74) *Attorney, Agent, or Firm*—Ostrolenk, Faber, Gerb & Soffen, LLP

(57) ABSTRACT

There is disclosed a hybrid laminate comprising: a substrate layer containing a compact of first powder; and a functional material layer being in contact with the substrate layer and containing a compact of second powder; wherein the compact of the first powder comprises a glass material; the compact of the second powder comprises a ceramic material having at least one specific electric property selected from dielectricity, magnetism, resistivity and insulation; at least a part of the first powder is in a sintered state; and the second powder is in an unsintered state and is bonded together by diffusion or a flow of a part of the material of the substrate layer into the functional material layer.

20 Claims, 4 Drawing Sheets

HYBRID LAMINATE AND MANUFACTURING METHOD THEREFOR

BACKGROUND OF THE INVENTION

1. Field of the Invention

The present invention relates to hybrid laminates and to manufacturing methods therefor, and more particularly, relates to a hybrid laminate which is provided with a functional material layer comprising a ceramic material having a specific electric property, such as dielectricity, magnetism, resistivity and insulation, and which can be advantageously used for electronic devices, such as multilayer circuit boards and electronic devices in the form of chips, and to a manufacturing method therefor.

2. Description of the Related Art

As laminates of interest in the present invention, there is, for example, a unit body in the form of a chip having a laminated structure provided in a multilayer circuit board having a laminated structure or an electronic device. The internal structures of these multilayer circuit boards and unit bodies, in general, are provided with internal conductive members, such as, internal electrodes or via hole connecting portions.

When substrates used for the multilayer circuit boards and unit bodies, as described above, are composed of a ceramic, a baking step for the substrate for sintering the ceramic is generally required in the production thereof. Consequently, the internal conductive members are also treated by baking during the baking step for the substrate.

In order to meet current requirements for higher frequency and higher speed of signals in the field of electronic apparatuses, low resistance metals, such as silver, gold and copper, must be used as conductive components for the internal conductive members described above.

Under the circumstances thus described, in order to make the internal conductive members provided with conductive components of low resistance metals, such as silver, gold and copper, simultaneously sinterable when the substrate is sintered, the substrate must be sinterable at, for example, 1,000° C. or less. Consequently, as an ingredient material for the substrate, a composite material including glass in addition to the ceramic, in which the glass functions as an auxiliary agent for sintering a ceramic, is advantageously used.

By using glass-ceramic multilayer circuit boards provided with the substrate composed of a composite of a glass and a ceramic, as described above, high-density-wiring and a thin-layer structure can be realized, whereby, in response to recent trends to make electronic chip devices compact and light-weight, demands to make circuit boards to be mounted with these chip devices compact and light-weight can also be advantageously satisfied.

As an embodiment of glass-ceramic multilayer circuit boards, there is a glass-ceramic multilayer circuit board obtained by simultaneously baking a substrate and a functional material, in which, on a green sheet containing glass powders and ceramic powders to be formed into a substrate, functional material is formed by coating functional material slurry containing powders composed of a ceramic having specific electric properties, such as dielectricity and magnetism, or by laminating a green sheet formed by molding. According to the glass-ceramic multilayer circuit boards described above, a specific function or multiple functions can be given thereto.

When the glass-ceramic multilayer circuit boards described above are produced, the functional material is simultaneously baked with the substrate. Consequently, an appropriate amount of the glass powders, which are the same as those contained in the substrate, is added to the functional material slurry to minimize differences in coefficients of expansion between the substrate and the functional material slurry during baking and differences in shrinkage rates therebetween during sintering so as to prevent occurrence of defects, such as separations at the interface.

In addition, after a mother laminate is formed by employing a manufacturing method substantially equivalent to that used for producing the glass-ceramic multilayer circuit board using the functional material slurry described above, chips used as unit bodies for a plurality of electronic devices can be obtained by cutting the mother laminate.

FIG. 1 is a capacitor 1, produced by the method described above, shown in a cross-sectional view.

The capacitor 1 is provided with a unit body 5 composed of a laminate having a functional material layer 2 and substrates 3 and 4 disposed so as to be in contact with both sides of the functional material layer 2. Internal electrodes 6 and 7 as internal conductive members are formed along the individual interfaces of the functional material layer 2 with substrates 3 and 4 so as to oppose each other with the functional material layer 2 therebetween. The internal electrodes 6 and 7 extend to opposing edge faces 8 and 9 of the unit body 5, and are connected to external electrodes 10 and 11 formed on the edge faces 8 and 9, respectively.

The unit body 5 described above is obtained by cutting a mother laminate, and the mother laminate is provided with elements individually corresponding to the functional material layer 2, the substrate layers 3 and 4, and the internal electrodes 6 and 7.

The substrate layers 3 and 4, at a stage before baking is performed, contain glass powders and ceramic powders. In addition, the functional material layer 2, at a stage before baking is performed, contains powders composed of a dielectric ceramic having a dielectric property. The mother laminate or the unit body 5 is obtained after the baking step. In order to minimize differences in coefficients of expansion between the substrates 3 and 4 and the functional material layer 2 during baking and differences in shrinkage rates therebetween during sintering, an appropriate amount of the glass powders, which are the same as those contained in the substrates 3 and 4, is added to the functional material slurry to be formed into the functional material layer 2.

As has been thus described, the functional material layer 2 in the capacitor 1 contains the dielectric ceramic so as to yield greater static capacitance between the internal electrodes 6 and 7. Accordingly, the dielectric ceramic contained in the functional material layer 2 preferably has a higher density.

However, in order to decrease differences in coefficients of expansion between the substrates 3 and 4 and the functional material layer 2 during baking and differences in shrinkage rates therebetween during sintering, a certain amount of the glass powders, which are the same as those contained in the substrates 3 and 4, is necessarily added to the functional material layer 2. As a result, the density of the dielectric ceramic contained in the functional material layer 2 may be decreased, and a dielectric property required for the functional material layer 2 may be degraded in some cases.

SUMMARY OF THE INVENTION

To overcome the above described problems, one preferred embodiment of the present invention provides a hybrid laminate comprising: a substrate layer containing a compact of first powders; and a functional material layer being in contact with the substrate layer and containing a compact of second powders; wherein the compact of the first powders comprises a glass material; the compact of the second powders comprises a ceramic material having at least one specific electric property selected from dielectricity, magnetism, resistivity and insulation; at least a part of the first powders is in a sintered state; and the second powders are in an unsintered state and are bonded together by diffusion or a flow of a part of the material of the substrate layer into the functional material layer.

In the above described hybrid laminate, the part of the material of the substrate layer preferably diffuses or flows over the entire area of the functional material layer, and all second powders are preferably bonded together by the material of the substrate layer.

In the above described hybrid laminate, at least a part of the first powders preferably has a melting point less than a sintering temperature for sintering the second powders.

In the above described hybrid laminate, the glass material preferably comprises a material that is vitrified through melting thereof caused by sintering.

In the above described hybrid laminate, the compact of the first powders preferably further comprises a ceramic material.

In the above described hybrid laminate, the compact of the first powders preferably comprises an admixture containing alumina and at least one of crystallized anorthite glass, borosilicate glass and crystallized cordierite glass.

The above described hybrid laminate may have a structure comprising plural substrate layers in which the plural substrate layers are laminated with the functional material layer therebetween, or may have a structure comprising plural functional material layers in which the plural functional material layers are laminated with the substrate layer therebetween. In the latter case, the plural functional material layers may comprise a first and a second functional material layer, and ceramic powders contained in the first functional material layer and ceramic powders contained in the second functional material layer may differ from each other in terms of an electric property.

When the hybrid laminate of the present invention is applied to electronic devices, the hybrid laminate further comprises a conductive member provided on the surface and/or at the inside thereof.

Another preferred embodiment of the present invention provides a manufacturing method of the hybrid laminate as described above. In order to solve the technical problems described above, the method for manufacturing a hybrid laminate comprises a first step of preparing first powders containing a glass material; a second step of preparing second powders having at least one specific electric property selected from dielectricity, magnetism, resistivity and insulation, and not being sintered at a temperature sufficient to sinter at least a part of the first powders; a third step of producing a hybrid laminate in a green state comprising a substrate layer in a green state containing the first powders and a functional material layer in a green state provided so as to be in contact with the substrate layer and containing the second powders; and a fourth step of baking the laminate in a green state at a predetermined temperature, in which at least a part of the first powders is sintered, and a part of the material of the substrate layer diffuses or flows into the functional material layer so that the second powders are bonded together without being sintered.

In the first step in the method for manufacturing the hybrid laminate the described above, substrate layer is preferably prepared in a state of a first green sheet containing the first powders.

In the first step in the method for manufacturing the hybrid laminate, the functional material layer is preferably prepared in a state of a second green sheet containing the second powders, and the first step may further comprise a step of laminating the second green sheet so as to be in contact with the first green sheet.

According to the above structure and arrangement, baking at low temperature can be performed for obtaining the hybrid laminate, and, in the functional material layer, since it is sufficient to diffuse or flow the glass material of the substrate layer in an amount sufficient to tightly bond the second powders together containing the ceramic material having a specific electric property, density of the ceramic material having a specific electric property contained in the functional material layer can be increased. As a result, the specific electric property of the ceramic material in the functional material layer can be maximally utilized, and when the hybrid laminates of the present invention are applied to electronic devices, the electronic devices having a superior electric property can be realized.

In addition, since the substrate layer is provided so as to give mechanical strength required for the hybrid laminate, and the functional material layer is provided so as to give an electric property to the hybrid laminate, a specific electric function or a number of electric functions can be optionally given to the hybrid laminate. As a result, electronic devices having an optional function can be realized, and electronic devices having various functions can be realized.

For example, when the functional material layer is composed of a first and a second functional material layer, and when a ceramic material contained in the first functional material layer and a ceramic material contained in the second functional material layer are designed to be different from each other in terms of an electric property, an electronic device having hybrid characteristics, such as an LC filter, can be readily realized.

Furthermore, concerning a combination of a ceramic material contained in the functional material layer and a glass material contained in the substrate material, when two materials which do not react with each other are used, a function suppressing shrinkage during baking can be given to the functional material layer, and hence, a hybrid laminate having superior dimensional stability can be obtained.

When a part of the material of the substrate layer is designed so as to diffuse and flow over the entire area of the functional material layer, and all second powders are designed so as to be tightly bonded together by the material of the substrate layer, the mechanical strength of the functional material layer can be further improved.

When at least a part of the first powders is designed to have a melting point less than a sintering temperature for the second powders, the second powders can be more reliably bonded together in a baking step without sintering by using a part of the material of the substrate layer.

In addition, when the compact of the first powders contained in the substrate layer also contains a ceramic material, the mechanical strength of the hybrid laminate can be further increased.

Other features and advantages of the present invention will become apparent from the following description of the invention which refers to the accompanying drawings.

DESCRIPTION OF THE PREFERRED EMBODIMENTS

Figure 1:
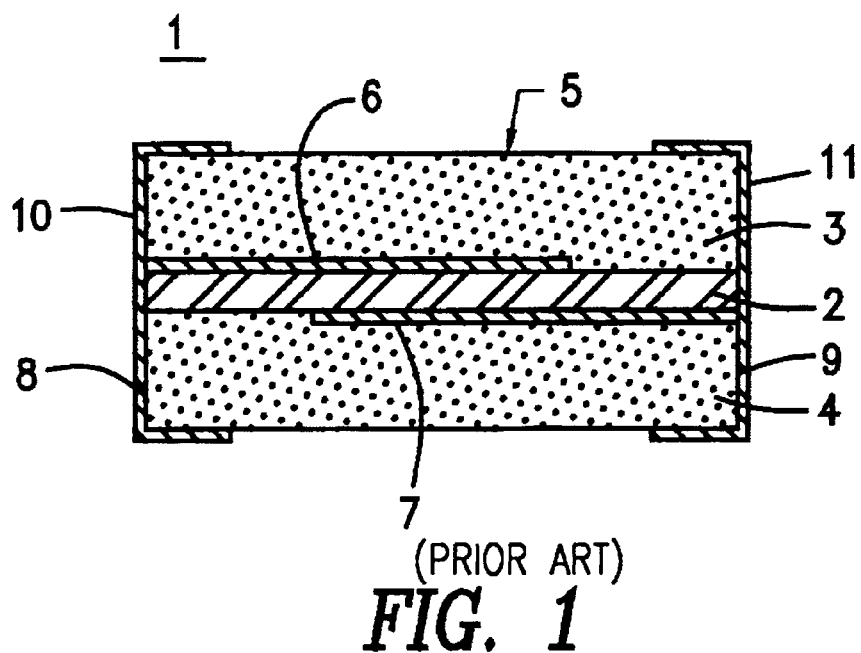
FIG. 1 is a cross-sectional view of a prior art capacitor 1 of interest in the present invention.
Figure 2:
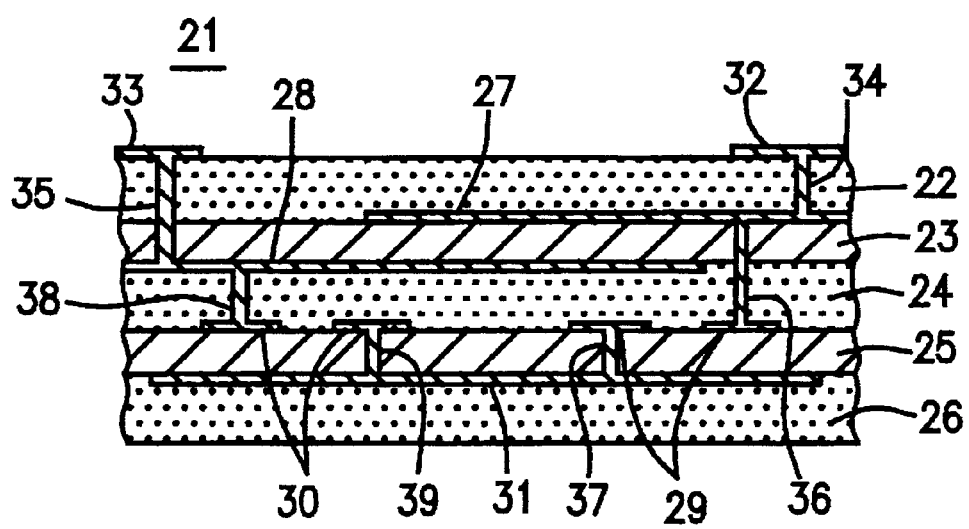
FIG. 2 is a cross-sectional view showing a part of a multilayer circuit board 21 as a hybrid laminate according to a first embodiment of the present invention.
Figure 3:
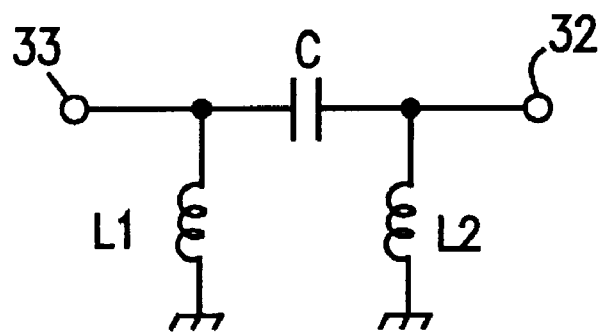
FIG. 3 shows an equivalent circuit realized by the part of the multilayer circuit board 21 shown in FIG. 2.

FIG. 2 is a cross-sectional view showing a part of a multilayer circuit board 21 according to a first embodiment of the present invention. FIG. 3 shows an equivalent circuit realized by the part of the multilayer circuit board 21 shown in FIG. 2.

The multilayer circuit board 21 is provided with a laminated structure comprising, from the top thereof, a substrate layer 22, a functional material layer 23 in contact therewith, a substrate layer 24 in contact therewith, a functional material layer 25 in contact therewith, and a substrate layer 26 in contact therewith.

Capacitor electrodes 27 and 28 as an internal electrode member are formed so as to oppose each other with the functional material layer 23 therebetween. In addition, along the interface between the substrate layer 24 and the functional material layer 25, inductor electrodes 29 and 30 as an internal conductive member are formed. Furthermore, along the interface between functional material layer 25 and the substrate layer 26, a ground electrode 31 as an internal conductive member is formed.

On a surface of the multilayer circuit board 21, more specifically, on the outside surface of the substrate layer 22, external terminal electrodes 32 and 33 as an external electrical conductive member are formed.

One external terminal electrode 32 is connected to one capacitor electrode 27 via a via hole connecting portion 34, and the other external terminal electrode 33 is connected to the other capacitor electrode 28 via a via hole connecting portion 35. The capacitor electrode 27 is connected to one end of one inductor electrode 29 via a via hole connecting portion 36, and the other end of this inductor electrode 29 is connected to the ground electrode 31 via a via hole connecting portion 37. The other capacitor electrode 28 is connected to one end of the other inductor electrode 30 via a via hole connecting portion 38, and the other end of the other inductor electrode 30 is connected to the ground electrode 31 via a via hole connecting portion 39.

As thus described, the multilayer circuit board 21 realizes, by the part thereof shown in FIG. 2, an equivalent circuit as shown in FIG. 3. In FIG. 3, capacitance C is given by the capacitor electrodes 27 and 28, and inductances L1 and L2 are given by the inductor electrodes 30 and 29, respectively.

In order to produce the multilayer circuit board 21 described above, green sheets to be formed into the substrate layers 22, 24, and 26 are prepared, and green sheets to be formed into the functional material layers 23 and 25 are prepared. On surfaces of specified green sheets, the capacitor electrodes 27 and 28, the inductor electrodes 29 and 30, and the ground electrode 31, which are the internal conductive members, are formed, and in specified green sheets, the via hole connecting portions 34 to 39 as the internal conductive members are provided.

Next, these green sheets are laminated so as to have a cross-sectional structure as shown in FIG. 2, and are baked at appropriate conditions after being pressed. Subsequently, the external terminal electrodes 32 and 33 as an external conductive member are formed. The external terminal electrodes 32 and 33 may be formed at a stage before baking is performed.

The green sheets to be formed into the substrate layers 22, 24 and 26 contain glass powders, and preferably, also contain ceramic powders.

A glass material comprising the glass powders mentioned above may include a material vitrified through melting thereof by baking. As the glass material, for example, crystallized anorthite glass is advantageously used, and in addition, borosilicate glass, crystallized cordierite glass and the like can be used.

As a material composing the ceramic powders mentioned above, for example, alumina is advantageously used.

In order to obtain the green sheets containing the glass powders and the ceramic powders described above, a slurry is prepared by blending a dispersing medium, a binder, and the like with the glass powders and the ceramic powders, and then sheet formation is performed by applying the slurry using a doctor blade method.

As the dispersing medium mentioned above, water, toluene, an alcohol or a mixture thereof can be used, and as the binder, a butyral resin, an acrylic resin, a urethane resin, vinyl acetate resin, polyvinyl alcohol and the like can be used.

In addition, when necessary, plasticizers, dispersing agents, deforming agents and the like may be added to the slurry described above.

For forming the green sheets, in addition to the doctor blade method, there are other methods such as extrusion, roll forming and powder press forming.

The green sheets to be formed into the functional material layers 23 and 25 contain powders composed of a ceramic material having a specific electric property.

In the embodiment, since the capacitor electrodes 27 and 28 are formed on the functional material layer 23, the green sheets to be formed into the functional material layer 23 contain dielectric ceramic powders, such as barium titanate ceramic powders, having a dielectric property.

Since the inductor electrodes 29 and 30 are formed on the functional material layer 25, the green sheets to be formed into the functional material layer 25 contain magnetic ceramic powders, such as ferrite, having a magnetic property.

The functional ceramic powders having these specified electric properties are made to be in the form of slurry by adding a dispersing medium and a binder, and are then formed into the green sheets by applying the slurry using a doctor blade method.

The binder and dispersing medium contained in the slurry for the functional material layers 23 and 25 may be equivalent to, or differ from, the binder and the dispersing medium contained in the slurry for the substrate layers 22, 24, and 26, described above.

Concerning the formation of the green sheets for the functional material layers 23 and 25, in addition to a doctor blade method, extrusion, roll forming, powder press forming and the like can be used.

After obtaining the green sheets for forming the functional material layers 23 and 25, instead of alternately laminating these green sheets with the green sheets to be formed into the substrate layers 22, 24 and 26, the slurry for forming the functional material layers 23 and 25 can be coated on the green sheets to be formed into the substrate layers 22, 24 and 26, by a method, such as spray coating, roll coating, dip coating and printing.

The temperature applied to the baking step does not sinter the functional ceramic material powders respectively contained in the functional material layers 23 and 25, but enables the glass powders contained in the substrate layers 22, 24 and 26 to melt. Consequently, by this baking step, the binder and the like contained in the substrate layers 22, 24 and 26, and in the functional material layers 23 and 25, are removed. In addition, glass composing the glass powders contained in the substrate layers 22, 24 and 26 are melted, and hence, the substrate layers 22,24 and 26 are fixed. Simultaneously, parts of molten glass generated by the fusion of the glass powders contained in the substrate layers 22, 24 and 26 diffuse or flow into the functional material layers 23 and 25, and penetrate therein primarily by capillary action. As a result, the glass penetrated fills gaps between the functional ceramic material powders and bonds the functional material ceramic powders together.

When the functional material ceramic powders contained in the functional material layers 23 and 25 become finer, capillary action causing a viscous flow of the glass becomes greater, and hence, a denser filling state of the glass can be readily achieved.

As has been thus described, the multilayer circuit board 21 as shown in FIG. 2 is obtained.

As can be seen from the method for manufacturing the multilayer circuit board 21 thus described, a combination having superior wettability between the functional ceramic materials contained in the functional material layers 23 and 25 and the glass materials contained in the substrate layers 22, 24 and 26 is preferable.

The glass diffusing or flowing into the functional material layers 23 and 25 may react with the functional materials, and as a result, liquid phase sintering may proceed in some cases. By the reaction mentioned above, At serious defects may not occur, however, in view of improved dimensional stability after sintering, a material which is unlikely to react with the glass material is preferably selected as the functional ceramic material.

In the multilayer circuit board 21 shown in FIG. 2, by modifying a part of the multilayer circuit board 21, for example, an LC filter unit in the form of LS a chip can be formed. That is, an LC filter having a circuit equivalent to that shown in FIG. 3 can be formed by eliminating the external terminal electrodes 32 and 33 and the via hole connecting portions 34 and 35, which are shown in FIG. 2 by forming external terminal electrodes at positions at which the broken edge lines are shown in FIG. 2 as edge faces, and by connecting the capacitor electrodes 26 and 28 to the respective external terminal electrodes.

Figure 4:
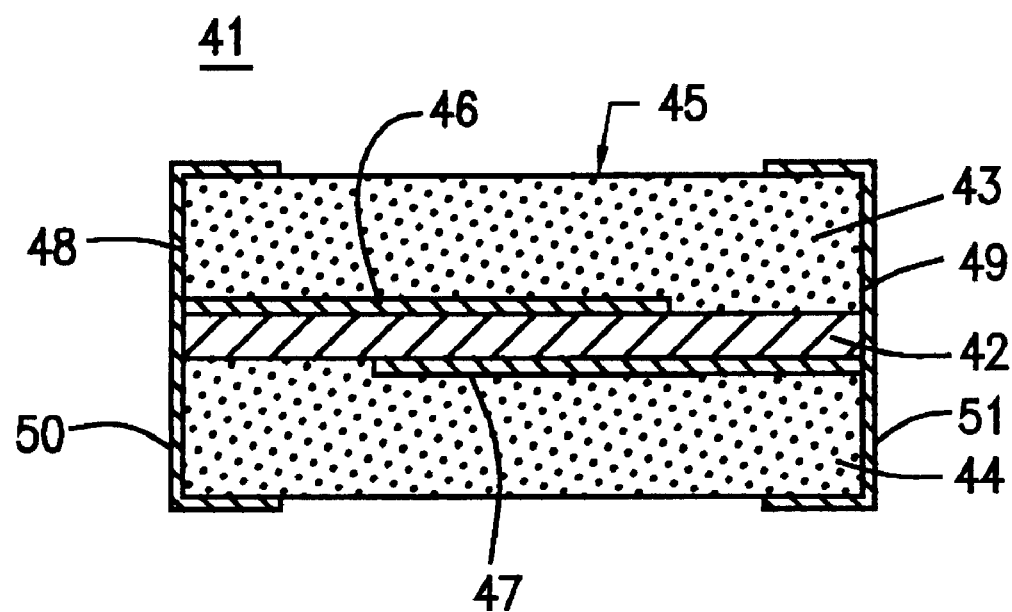
FIG. 4 is a cross-sectional view of a capacitor 41 according to a second embodiment of the present invention.

FIG. 4 is a cross-sectional view showing a capacitor 41 according to a second embodiment of the present invention.

The capacitor 41 is provided with a unit body 45 composed of a hybrid laminate having a functional material layer 42 and substrate layers 43 and 44 formed at both sides of the functional material layer 42 so as to be in contact therewith.

Internal electrodes 46 and 47 are formed as an internal conductive member along individual interfaces of the functional material layer 42 with the substrate layers 43 and 44, and are formed so as to oppose each other with the functional material layer 42 therebetween. The internal electrodes 46 and 47 extend to opposing edge faces 48 and 49 of the unit body 45, respectively, and are connected to external electrodes 50 and 51 formed on the edge faces 48 and 49 as an external conductive member.

The unit body 45 can be obtained by cutting a mother laminate, and the mother laminate has elements individually corresponding to the functional us material layer 42, the substrate layers 43 and 44, and the internal electrodes 46 and 47.

The mother laminate for forming the unit body 45 can be produced by a method substantially similar to that used for producing the multilayer circuit board 21 described above.

That is, at a stage before baking is performed, the substrate layers 43 and 44 provided at the mother laminate contain glass powders and ceramic powders. In addition, at a stage before baking is performed, the functional material layer 42 contains the powders composed of a dielectric ceramic having a dielectric property, and does not contain the glass material. In the baking step, at least part of the glass powders contained in the substrate layers 43 and 44 are sintered, the ceramic powders contained in the substrate layers 43 are tightly bonded together and the ceramic powders contained in the substrate layer 44 are tightly bonded together, and part of the glass material contained in the substrate layers 43 and 44 diffuses or flows into the functional material layer 42. Consequently, the dielectric ceramic powders contained in the functional material layer 42 are tightly bonded together, without being sintered, by the glass material diffusing or flowing thereinto.

Figure 5:
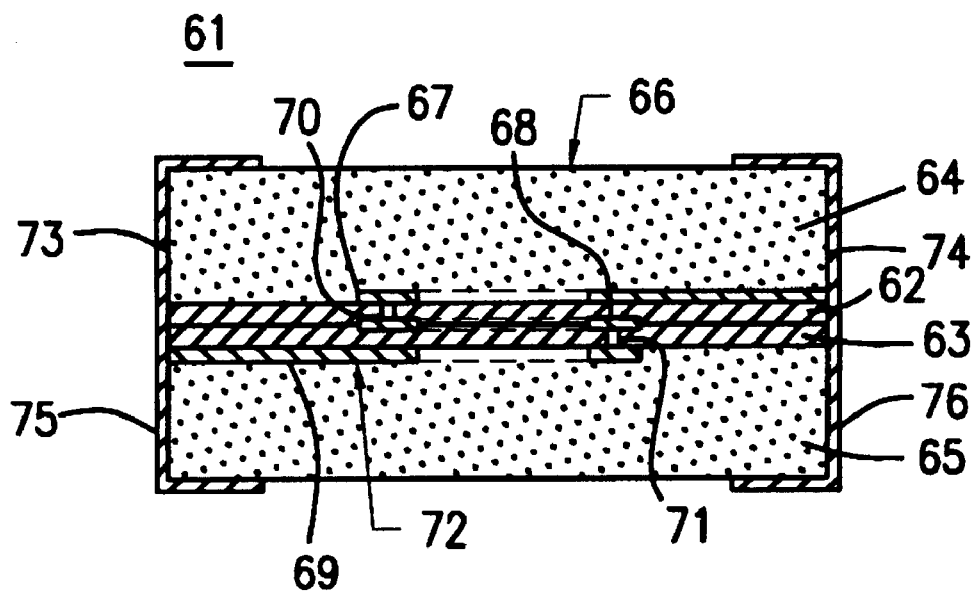
FIG. 5 is a cross-sectional view of an inductor 61 according to a third embodiment of the present invention.

FIG. 5 is a cross-sectional view of an inductor 61 according to a third embodiment of the present invention.

The inductor 61 is provided with a unit body 66 composed of a hybrid laminate having two functional material layers 62 and 63, which are disposed so as to be in contact with each other, and substrate layers 64 and 65 formed at sides of the functional material layers 62 and 63 so as to be in contact therewith, respectively.

An inductor electrode 67 is formed along the interface between the functional material layer 62 and the substrate layer 64, an inductor electrode 68 is formed along the interface between the functional material layer 62 and the functional material layer 63, and an inductor electrode 69 is formed along the interface between the functional material layer 63 and the substrate layer 65. In addition, a via hole connecting portion 70 is formed so as to penetrate the functional material layer 62, and a via hole connecting portion 71 is formed so as to penetrate the functional layer 63.

These inductor electrodes 67 to 69 and the via hole connecting portions 70 and 71 are used as an internal conductive member, and the inductor electrode 67, the via hole connecting portion 70, the inductor electrode 68, the via hole connecting portion 71 and the inductor electrode 69 are sequentially connected. As a result, an inductor conductor 72 having an extending portion at a part thereof in the form of a coil is formed. Ends of the inductor conductor 72 extend to opposing edge faces of the unit body 66 and are connected to external electrodes 75 and 76 formed as an external electrode on the edge faces 73 and 74, respectively.

The unit body 66 described above can also be obtained by cutting a mother laminate, and the mother laminate is provided with elements individually corresponding to the functional material layers 62 and 63, the substrate layers 64 and 65, and the inductor electrodes 67 to 69, and via hole connecting portions 70 and 71.

The mother laminate to obtain the unit body 66 thus described can be produced by a method substantially similar to that used for producing the mother laminate for the multilayer circuit board 21 or the unit body 45.

That is, at a stage before baking is performed, the substrate layer 64 and 65 contain glass powders and ceramic powders. In addition, the functional material layers 62 and 63, at a stage before baking is performed, contain powders composed of a magnetic ceramic having a magnetic property, and contain no glass material. In the baking step, the glass material contained in the substrate layers 64 and 65 diffuses or flows into the functional material layers 62 and 63, and as a result, the magnetic powders contained in the functional material layers 62 and 63 are tightly bonded to each other.

Figure 6:
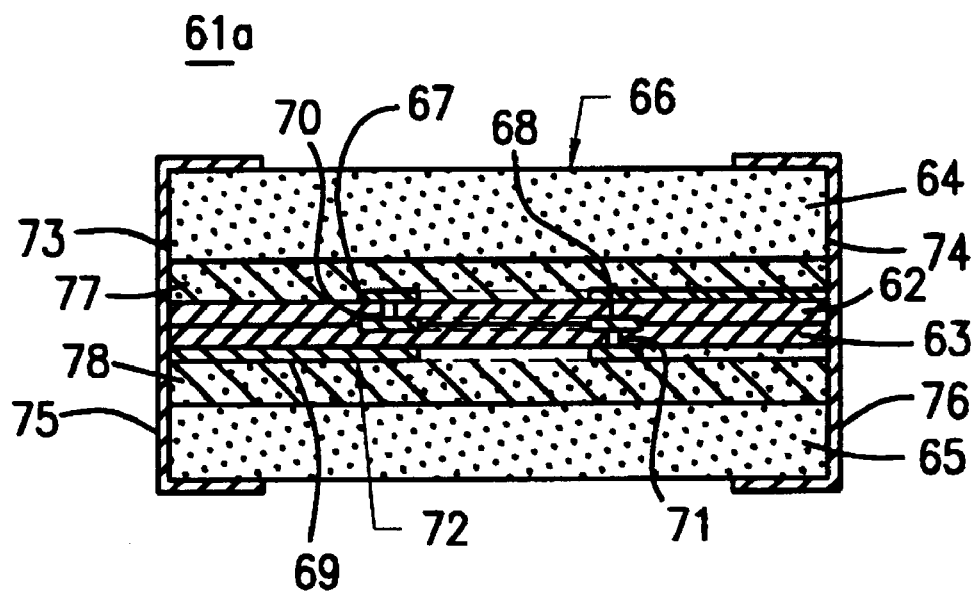
FIG. 6 is a cross-sectional view of an inductor 61 a according to a fourth embodiment of the present invention.

FIG. 6 is a cross-sectional view showing an inductor 61 a according to a fourth embodiment of the present invention. Since the inductor 61 a shown in FIG. 6 is provided with a number of elements corresponding to those provided at the inductor 61 shown in FIG. 5, the same reference numerals of the elements shown in FIG. 5 designate the same elements in FIG. 6, and a duplicated description will be omitted.

The inductor 61a shown in FIG. 6 is characterized in that in a unit body 66a, other functional material layers 77 and 78 are provided between the functional material layer 62 and the substrate layer 64 and between the functional material layer 63 and the substrate layer 65, respectively.

The functional material layers 77 and 78, which function so as to suppress shrinkage during a baking step, contain ceramic powders and no glass powders at a stage before baking is performed. As the ceramic powders used in the embodiment, ceramic powders having an optional electric property, such as dielectricity, magnetism, resistivity and insulation, can be used so long as the ceramic has no adverse influence on the electric property required for the inductor 61a. For example, a ceramic material having an insulating property, such as alumina, can be safely used.

In the baking step, glass materials contained in the substrate layers 64 and 65 diffuse or flow into the functional material layers 77, 78, 62, and 63, and tightly bond ceramic powders together contained in the functional material layers 77, 78, 62, and 63.

In the baking step described above, the shrinkage suppressing functions by the functional material layers 77 and 78 show noticeable effects, in particular, when the glass materials contained in the substrate layers 64 and 65 and the ceramic materials contained in the functional material layers 62 and 63 react with each other, and as a result, the functional material layers 62 and 63 tend to shrink along the plane directions. Since the ceramic powders, such as alumina, contained in the functional material layers 77 and 78 hardly react with a glass material, no shrinkage of the functional material layers 77 and 78 along the plane directions thereof substantially occurs, and as a result, shrinkage of the functional material layers 62 and 63 in contact with the functional material layers 77 and 78 are advantageously suppressed.

It is advantageous that the functional material layers 77 and 78 described above be provided so as to be in contact with the functional material layers 62 and 63; however, the functional material layers 77 and 78 may be provided at other portions of the unit body 66a. In addition, a functional material layer in order to suppress shrinkage, such as the functional material ron layers 77 and 78, can be applied to the multilayer circuit board 21, the capacitor 41, and the like.

Figure 7:
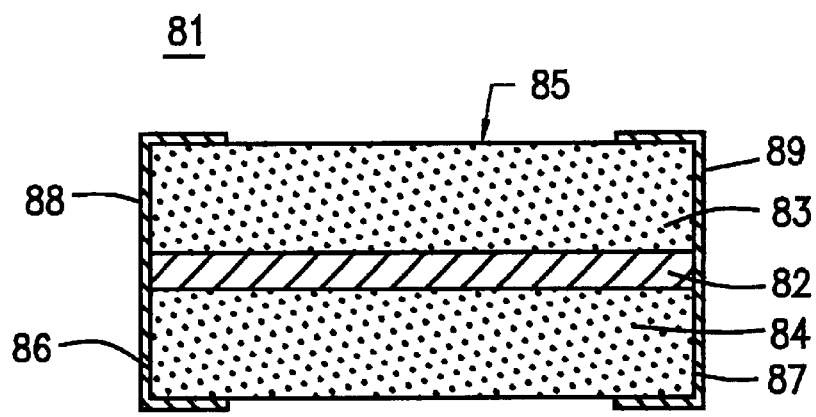
FIG. 7 is a cross-sectional view of a resistor 81 according to a fifth embodiment of the present invention.

FIG. 7 is a cross-sectional view showing a resistor 81 according to a fifth embodiment of the present invention.

The resistor 81 is provided with a unit body 85 composed of a hybrid laminate having a functional material layer 82 and substrate layers 83 and 84 disposed so as to be in contact with both sides of the functional material layer 82.

In addition, on opposing edge faces 86 and 87 of the unit body 85, external electrodes 88 and 89 are formed, and the external electrodes 88 and 89 are connected to edge faces of the functional material layer 82, respectively.

The unit body 85 can be obtained by cutting a mother laminate similar to those of the capacitor 41 described above and the like, and the mother laminate is provided with elements individually corresponding to the functional material layer 82 and the substrate layers 83 and 84.

In the mother laminate for obtaining the unit body 85, at a stage before baking is performed, the substrate layers 83 and 84 contain glass powders and ceramic powders. In addition, the functional material layer 82, at a stage before baking is performed, contains powders composed of a resistance ceramic having resistance and no glass material. In the baking step, the glass materials contained in the substrate layers 83 and 84 diffuse or flow into the functional material layer 82 and tightly bond the ceramic powders together contained in the functional material layer 82.

In the embodiments described hereinbefore, only one ceramic having a specific electric property is contained in the individual functional material layers 23, 25, 42, 62, 63, 77, 78 and 82; however, plural types of ceramics may be contained, and furthermore, for example, dielectric ceramic powders and magnetic ceramic powders may be mixed together and may be contained therein.

Next, the present invention will be described with reference to particular examples.

EXAMPLE 1

Example 1 is to produce a capacitor 41 as shown in FIG. 4.

Firstly, silicon-calcium-aluminum-magnesium (Si—Ca—Al—Mg) glass powders having a grain diameter of approximately 5 $\mu$m and alumina powders having a grain diameter of approximately 0.5 $\mu$m were prepared as raw ingredients for the substrates 43 and 44, and they were mixed together at the ratio of 60 parts by weight of the former powder and 40 parts by weight of the latter powder. Subsequently, a dispersing agent and a binder were added to the mixture and blended, whereby slurry was obtained.

After removing air bubbles from the slurry, sheets were formed by applying the slurry using a doctor blade method, and then by drying, first green sheets to be formed into 300 $\mu$m-thick substrate layers 43 and 44 were made.

Meanwhile, by using titanate barium ceramic powders having a grain diameter of approximately 0.7 $\mu$m and a dielectric constant ($\epsilon$) of 1,700 as dielectric ceramic powders for a functional material layer 42, a second green sheet to be formed into an 18 $\mu$m-thick functional material layer 42 was made by a method similar to that for making the first green sheets described above.

Next, on both sides of the second green sheet, internal electrodes 46 and 47 were formed by baking a silver paste so that an effective opposing area of the electrodes 46 and 47 was 3 mm square. Then, the first green sheets were laminated so as to have the second green sheet therebetween, and were pressed at a pressure of 1000 kg/cm$^2$. Subsequently, a mother laminate in a green state thus obtained was baked at 880° C. for 2 hours.

When the appearance of the baked mother laminate was observed, overall bowing and defects, such as separations at the individual interfaces of the functional material layer 42 with the substrate layers 43 and 44, were not present, and a superior mother laminate was accordingly obtained. In addition, shrinkage along the plane directions was 1.2% and water absorption was 0%.

Furthermore, by cutting the mother laminate after baking, a chip to be formed into a unit body 45 was obtained, and external electrodes 50 and 51 were provided at the unit body 45 by baking a silver paste, whereby the capacitor 41 was completed. Concerning the capacitor 41, capacitance of the functional material layer 42 was measured by an LCR meter, and the dielectric constant ($\epsilon$) obtained therefrom was 170 at 1 MHZ.

Meanwhile, as comparative examples 1 and 2, except for addition of 40 percent by volume and 50 percent by volume of borosilicate glass powders to the slurry for forming green sheets to be formed into functional material layers, the operations similar to those performed in the example described above were performed, whereby baked mother laminates and capacitors were made. Then, water absorptions, shrinkages and dielectric constants ($\epsilon$) were obtained.

In Table 1 shown below, absorptions, shrinkages and dielectric constants ($\epsilon$) of the example and the comparative examples 1 and 2 were listed.

TABLE 1

|  | Example | Comparative Example 1 | Comparative Example 2 |
| --- | --- | --- | --- |
| Added volume of glass | 0 vol % | 40 vol % | 50 vol % |
| Water absorption | 0% | 0% | 0% |
| Shrinkage | 1.2% | 11.2% | 11.3% |
| $\epsilon$ | 170 | 47 | 34 |

As can be seen from Table 1, even though the same baking temperature was applied as that in the comparative examples, a higher dielectric constant ($\epsilon$) can be obtained, and shrinkage can also be suppressed, compared to the comparative examples 1 and 2.

In another comparative example, a functional material layer 42 having 30 percent by volume of the glass therein was not densified by baking at 880° C.

Furthermore, in the case in which another dielectric ceramic powder such as titanate zirconate lead powder, was used as dielectric ceramic powders contained in the functional material layer 42, results substantially similar to those described above were obtained.

EXAMPLE 2

Example 2 is to produce an inductor 61 having a structure as shown in FIG. 5.

Firstly, as first green sheets for forming substrates 64 and 65, materials similar to those prepared in the example 1 were prepared.

Meanwhile, by using nickel-zinc ferrite powder having a grain diameter of approximately 0.5 $\mu$m as magnetic ceramic powders contained in functional material layers 62 and 63, the ferrite powders and a printing varnish were blended, whereby printing slurry in the form of paste was made.

Next, on the green sheet to be formed into one substrate layer 65, printing using a silver paste and printing using the printing slurry described above were repeatedly performed, so that inductor electrodes 67 to 69 and via hole connecting portions 70 and 71 were formed in addition to that the functional material layers 62 and 63 were formed. An inductor conductor formed by the inductor electrodes 67 to 69 and the via hole connecting portions 70 and 71 was designed to have 1.5 turns.

Next, the green sheet to be formed into the other substrate 64 was laminated so as to form a hybrid laminate, and the hybrid laminate from the green sheet to be formed into the substrate layer 65 to the green sheet to be formed into the other substrate 64 was pressed at 100 kg/cm².

Next, a mother laminate in a green state thus formed was baked at 880° C. for 2 hours in the air.

When the appearance of the baked mother laminate was observed, overall bowing and defects such as separations at the interfaces of the functional material layer 62 with the functional material layer 63 and the substrate layers 64, and the interface of the function material layer 63 with the substrate layer 65, were not present, and a superior mother laminate was accordingly obtained. In addition, shrinkage along the plane directions was 0.8% and water absorption was 0%.

Figure 8:
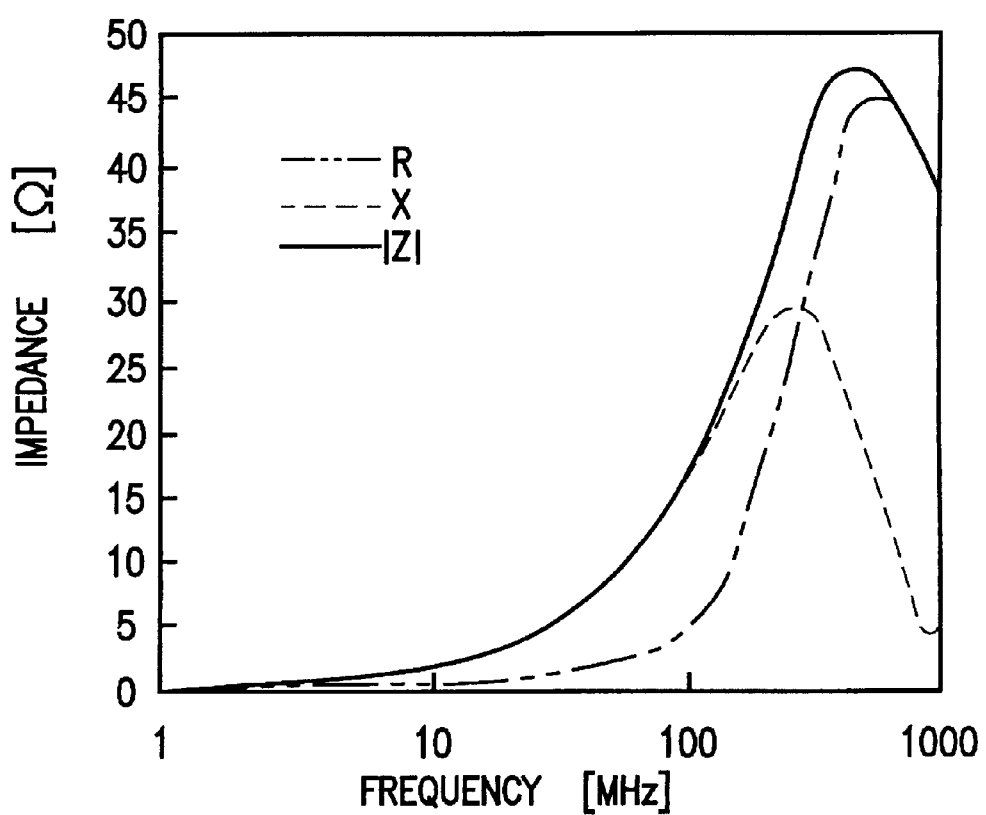
FIG. 8 is a graph showing frequency characteristics of impedance of the inductor 61 shown in FIG. 4 which was produced in Example 2.

Furthermore, by cutting the mother laminate after baking, a chip to be formed into a unit body 66 was obtained, and external electrodes 75 and 76 were provided at the unit body 66 by baking a silver paste, whereby the inductor 61 was completed. Concerning the inductor 61, frequency characteristics of impedance thereof were measured and filter properties were evaluated. In FIG. 8, the impedance versus frequency change was shown.

In FIG. 8, impedance (Z) is represented by Z=R+jX, and when impedance is represented by a complex number, R is a real part of a complex number, and j is an imaginary part of a complex number. When signals having a sine curve are inputted, the same parts in phase are measured as R and a shift in phase is measured as X and |Z| represents the square root of $R^2+X^2$, that is, $(R^2+X^2)^{1/2}$.

As shown in FIG. 8, according to the inductor 61 obtained in the example described above, a filter function having impedance of 17 $\Omega$ at 100 MHZ can be achieved.

In the case in which another magnetic ceramic powder, such as manganese-zinc ferrite powder, was used as a magnetic ceramic powder contained in the functional material layers 62 and 63, results substantially similar to those described above were also obtained.

In the embodiment described above, the shrinkage along planar directions was 0.8%; however, when a nickel-zinc ferrite used for the functional material layers 62 and 63 had a lower degree of synthesis, shrinkage along planar directions was not less than 5% in some cases. The reason for this is that a glass material diffusing or flowing into the functional material layers 62 and 63 reacts with the ferrite material, and as a result, liquid phase sintering proceeds. In order to suppress the shrinkage mentioned above and improve dimensional stability, it is preferable to employ a structure provided with other functional material layers 77 and 78 as shown in FIG. 6. In the structure shown in FIG. 6, when the functional material layers 77 and 78 containing alumina having a grain diameter of approximately 0.5 $\mu$m were formed to a thickness of 8 $\mu$m, respectively, shrinkage along planar directions was suppressed to be approximately 0.5%.

EXAMPLE 3

The example 3 is to produce a resistor 81 having a structure as shown in FIG. 7.

As green sheets for forming the substrate layers 83 and 84, first green sheets similar to those prepared in the example 1 were prepared.

Meanwhile, as resistance ceramic powders contained in the functional material layer 82, ruthenium oxide (RuO) having a grain diameter of approximately 1 µm was blended with a printing varnish, and as a result, a printing slurry in the form of paste was made.

Next, to the entire surface of the green sheet to be formed into one substrate layer 84, the printing slurry was applied at a thickness of 18 µm by screen printing, and the green sheet to be formed into the other substrate 83 was laminated on the green sheet to be formed into the substrate layer 84 and was then pressed at 100 kg/cm$^2$.

Next, a mother laminate in a green state thus formed was baked at 880° C. for 2 hours in the air.

When the appearance of the baked mother laminate was observed, overall bowing and defects, such as separations at the interfaces of the functional material layer 82 with the substrate layers 83 and with the substrate layer 84, were not present, and a superior mother laminate was accordingly obtained. In addition, shrinkage along the plane directions was 3.0% and water absorption was 0%.

Furthermore, by cutting the mother laminate after baking, chips to be formed into a unit body 66 were obtained, and external electrodes 88 and 89 were provided at the unit body 66 by baking a silver paste, whereby the resistor 81 was completed. Concerning the resistor 81, resistance thereof was measured in order to obtain volume resistivity, and 0.03 Ω·mm was obtained.

In the case in which other resistance ceramic powders other than RuO powders were used as resistance ceramic powders contained in the functional material layer 82, results substantially similar to those described above were also obtained.

In the examples 1 to 3 described above, properties of the capacitor 41, the inductors 61 and 61a, or the resistor 81, each had a single function, were evaluated; however, evaluation for an electronic device having a single function can be applied to, for example, the multilayer circuit board 21 shown in FIG. 2. The reason for this is that the multilayer circuit board 21, other multilayer circuit boards, or a hybrid electronic apparatus can be considered to be an assembly composed of a plurality of electronic devices, each having a single function.

While the invention has been particularly shown and described with reference to preferred embodiments thereof, it will be understood by those skilled in the art that the forgoing and other changes in form and details may be made therein without departing from the spirit of the invention.

What is claimed is:

1. A hybrid laminate comprising:
    a substrate layer comprising a compact of first powder; and a functional material layer in contact with the substrate layer and comprising a compact of second powder;
    wherein the compact of the first powder comprises a glass and at least a part of the first powder is in a sintered state;
    the compact of the second powders comprises a ceramic material having at least one specific electric property selected from the group consisting of dielectricity, magnetism, resistivity and insulation; and
    wherein the second powder is in an unsintered state and the second powder is diffusion or flow bonded together by a part of the material of the substrate layer extending into the functional material layer.

2. The hybrid laminate according to claim 1, wherein the part of the material of the substrate layer diffused or flowed into the functional material layer has diffused or flowed over the entire area of the functional material layer, and substantially all the second powders are bonded together by the material of the substrate layer.

3. A hybrid laminate according to claim 2, wherein at least a part of the first powder has a melting point which is lower than the sintering temperature of the second powder.

4. A hybrid laminate according to claim 3, wherein the glass material comprises a material which is vitrified through melting thereof caused by sintering.

5. A hybrid laminate according to claim 4, wherein the compact of the first powder further comprises a ceramic material.

6. A hybrid laminate according to claim 5, wherein the compact of the first powder comprises an admixture of alumina and at least one of crystallized anorthite glass, borosilicate glass and crystallized cordierite glass.

7. A hybrid laminate according to claim 6, further comprising a plurality of the substrate layers, wherein a plurality of substrate layers present are laminated with the functional material layer therebetween.

8. A hybrid laminate according to claim 7, further comprising a plurality of the functional material layers, wherein a plurality of functional material layers present are laminated with the substrate layer therebetween.

9. A hybrid laminate according to claim 8, where in the plurality of functional material layers have a first functional material layer and a second functional material layer, and the ceramic material contained in the first functional material layer and the ceramic material contained in the second functional material layer are different from each other in an electric property.

10. A hybrid laminate according to claim 9, further comprising a conductive member provided on a surface or inside thereof or both, and wherein the substrate layer, the functional material layer and the conductive member constitute an electronic device.

11. A hybrid laminate according to claim 2, wherein the glass is anorthite glass.

12. A hybrid laminate according to claim 1, wherein the compact of the first powder further comprises a ceramic material.

13. A hybrid laminate according to claim 1, wherein the compact of the first powder comprises an admixture of alumina and at least one of crystallized anorthite glass, borosilicate glass and crystallized cordierite glass.

14. A hybrid laminate according to claim 1, further comprising a plurality of the substrate layers, wherein a plurality of substrate layers present are laminated with the functional material layer therebetween.

15. A hybrid laminate according to claim 1, further comprising a plurality of the functional material layers, wherein a plurality of functional material layers present are laminated with the substrate layer therebetween.

16. A hybrid laminate according to claim 1, wherein the functional material layer comprises first functional material layer and a second functional material layer each of which comprises a ceramic material, and the ceramic material contained in the first functional material layer and the ceramic material contained in the second functional material layer are different from each other in an electric property.

17. A method for manufacturing a hybrid laminate according to claim 1 comprising:

providing a first powder comprising a glass material;

providing a second powder having at least one electric property selected from the group consisting of dielectricity, magnetism, resistivity and insulation, and having a sinter temperature above the sintering temperature of at least a part of the first powder;

producing a hybrid laminate in a green state comprising a substrate layer in a green state containing the first powder, and a functional material layer in a green state in contact with the substrate layer and containing the second powder, and baking the green state laminate at a temperature at which at least a part of the first powder is sintered and a part of the material of the substrate layer is diffused or flowed into the functional material layer, said temperature being below the sintering temperature of the second powder, so that the second powder is bonded together without being sintered.

18. A method for manufacturing a hybrid laminate according to claim 17, comprising preparing a green state substrate layer containing the first powder as a first green sheet.

19. A method for manufacturing a hybrid laminate according to claim 18, comprising preparing the green state functional material layer as a second green sheet containing the second powder, and laminating the second green sheet so as to be in contact with the first green sheet.

20. A method for manufacturing a hybrid laminate according to claim 17, comprising preparing the green state functional material layer as a second green sheet.

* * * * *